United States Patent
Oshio

(10) Patent No.: US 8,573,058 B2
(45) Date of Patent: Nov. 5, 2013

(54) ACCELERATION SENSOR AND ELECTRONIC DEVICE

(75) Inventor: Masahiro Oshio, Shiojiri (JP)

(73) Assignee: Seiko Epson Corporation (JP)

( * ) Notice: Subject to any disclaimer, the term of this patent is extended or adjusted under 35 U.S.C. 154(b) by 367 days.

(21) Appl. No.: 12/710,569

(22) Filed: Feb. 23, 2010

(65) Prior Publication Data
US 2010/0212426 A1 Aug. 26, 2010

(30) Foreign Application Priority Data

Feb. 24, 2009 (JP) .................................. 2009-040319
Feb. 16, 2010 (JP) .................................. 2010-030989

(51) Int. Cl.
*G01P 15/125* (2006.01)

(52) U.S. Cl.
USPC ...................................................... 73/514.32

(58) Field of Classification Search
USPC ................. 73/514.32, 514.36, 514.38, 514.16
See application file for complete search history.

(56) References Cited

U.S. PATENT DOCUMENTS

| 5,569,852 | A | * | 10/1996 | Marek et al. | 73/514.32 |
| 6,151,966 | A | * | 11/2000 | Sakai et al. | 73/514.32 |
| 6,276,207 | B1 | * | 8/2001 | Sakai et al. | 73/514.16 |
| 6,318,174 | B1 | * | 11/2001 | Schmiesing et al. | 73/510 |
| 6,494,096 | B2 | * | 12/2002 | Sakai et al. | 73/514.32 |
| 6,694,814 | B2 | * | 2/2004 | Ishio | 73/514.32 |
| 6,906,394 | B2 | * | 6/2005 | Muto et al. | 257/415 |
| 7,004,026 | B2 | * | 2/2006 | Kano et al. | 73/514.32 |
| 7,111,513 | B2 | * | 9/2006 | Sugiura | 73/514.32 |
| 7,201,053 | B2 | * | 4/2007 | Yoshioka et al. | 73/514.32 |
| 7,275,435 | B2 | * | 10/2007 | Sugiura | 73/514.32 |
| 7,628,072 | B2 | * | 12/2009 | Koury et al. | 73/514.32 |

FOREIGN PATENT DOCUMENTS

JP 2004-286649 10/2004

* cited by examiner

*Primary Examiner* — Helen Kwok
(74) *Attorney, Agent, or Firm* — Harness, Dickey & Pierce, P.L.C.

(57) ABSTRACT

An acceleration sensor includes: a support member; a fixed electrode provided on the support member; a movable unit; a movable electrode provided on the movable unit and disposed opposed to the fixed electrode to generate capacity; and a projection extending from the opposed surface of at least either the fixed electrode or the movable electrode in one direction within the surface.

18 Claims, 5 Drawing Sheets

ACCELERATION SENSOR AND ELECTRONIC DEVICE

BACKGROUND

1. Technical Field

The present invention relates to an acceleration sensor which detects acceleration based on capacity change between a fixed electrode and a movable electrode.

2. Related Art

An acceleration sensor which detects acceleration based on capacity change between a fixed electrode provided on a support member and a movable electrode is known as an acceleration sensor. The movable electrode is provided on a movable unit having a weight, and the movable unit is connected with the support member by a spring. This type of acceleration sensor can detect acceleration having an element in the direction of capacity change between the fixed electrode and the movable electrode.

A structural resonance frequency of the acceleration sensor having this structure can be determined by mass m of the movable unit and a spring constant k with one-to-one correspondence. A value Q indicating the sharpness of the resonance is calculated by a calculation expression including an attenuation constant c as well as the mass m of the movable unit and the spring constant k, and is inversely proportional to the attenuation constant c.

For preferable transient response and shock resistance, the value Q of the acceleration sensor needs to be lowered. For example, the Q value in the range from about 0.5 to about 1.0 is required. Since the structural resonance frequency of the acceleration sensor is determined by the structure, the Q value is designed considering damping (attenuation force) indicated by the attenuation constant c as an effect produced by interaction between the components such as the support member and the movable unit and gas surrounding the components. The Q value decreases as the attenuation constant c increases.

For decreasing the Q value, a method is known which narrows the clearance between a movable member as the movable unit and a support substrate as the support member to increase a damping coefficient as the attenuation constant c utilizing slide damping produced when the movable member and the support substrate shift from each other (see JP-A-2004-286649 (pages 3 to 4, FIG. 1)).

When the clearance between the movable unit and the support member is narrow, however, collision destruction between the movable unit and the support member occurs by shock caused in the direction of narrowing the clearance between the movable unit and the support member. As a result, shock resistance lowers.

SUMMARY

It is an advantage of some aspects of the invention to solve at least a part of the problems described above, and the invention can be embodied as the following forms or aspects.

First Aspect

A first aspect of the invention is directed to an acceleration sensor which includes: a support member; a fixed electrode provided on the support member; a movable unit; a movable electrode provided on the movable unit and disposed opposed to the fixed electrode to generate capacity; and a projection extending from the opposed surface of at least either the fixed electrode or the movable electrode in one direction within the surface. In another embodiment, An acceleration sensor comprising:

a support member; a fixed electrode extending from the support member, in the form of an arm; a movable unit; a movable electrode extending from the movable unit and disposed opposed to the fixed electrode through a gap, in the form of an arm; a connection member connecting the support member and the movable unit, is possible an elastic deformation; and one of the fixed electrode and the movable electrode have an opposite surface opposed other, a projection is formed the opposite surface of at least either the fixed electrode or the movable electrode.

According to this aspect of the invention, gas existing in the clearance between the fixed electrode and the movable electrode flows in one direction by the function of the projection extending in one direction from the opposed surface when acceleration is given in the direction of changing the distance between the fixed electrode and the movable electrode. In this case, an attenuation constant c increases by squeeze film damping produced by the flow of the gas. Therefore, the attenuation constant c can be controlled by the structure of the clearance between the fixed electrode and the movable electrode without narrowing the gap between the movable unit and the support member. Accordingly, reduction of collision destruction between the movable unit and the support member and thus increase in shock resistance of the acceleration sensor can be achieved.

Second Aspect

A second aspect of the invention is directed to the acceleration sensor described above, wherein the projection extends along a line parallel with any of edges of the opposed surface. In another embodiment, the projection is formed from a tip member to a connection member of the support member at least either the fixed electrode or the movable electrode. The opposite surface has a one end in a direction perpendicular to the direction of extending in the opposite surface and the other end opposite side of the one end, the projection is formed at least either the one end or the other end.

According to this aspect of the invention, the projection is disposed in parallel with the edge. In this case, the flow of the gas existing in the clearance between the fixed electrode and the movable electrode can be further equalized in a constant direction. As a result, the attenuation constant c further increases by the squeeze film damping. Accordingly, further reduction of collision destruction between the movable unit and the support member and thus increase in shock resistance of the acceleration sensor can be achieved.

Third Aspect

A third aspect of the invention is directed to the acceleration sensor described above, wherein the projection is provided on an edge portion of an opposed area of the opposed surface.

According to this aspect of the invention, the projection is provided on the edge portion. In this case, most of the gas existing in the clearance between the fixed electrode and the movable electrode contributes to the squeeze film damping. As a result, the attenuation constant c further increases. Accordingly, further reduction of collision destruction between the movable unit and the support member and thus increase in shock resistance of the acceleration sensor can be achieved.

Fourth Aspect

A fourth aspect of the invention is directed to the acceleration sensor described above, wherein a plurality of the projections are provided in parallel with one another. In another embodiment, the projection is formed the opposite surface of the fixed electrode and the movable electrode.

According to this aspect of the invention, the plural projections are provided in parallel with one another. In this case, the flow of the gas can be further equalized in a constant direction, and thus the attenuation constant c further increases. Accordingly, further reduction of collision destruction between the movable unit and the support member and thus increase in shock resistance of the acceleration sensor can be achieved.

Fifth Aspect

A fifth aspect of the invention is directed to the acceleration sensor described above, wherein each of the fixed electrode, the movable electrode, the support member, and the movable unit has a laminated layer structure alternately piled up a conductive layer and an insulated layer. In another embodiment, the projection is formed by the use of the conductive layer or the insulated layer.

According to this aspect of the invention, the fixed electrode and the movable electrode are laminated layers. In this case, these electrodes can be processed for each layer, and the narrow portion can be easily formed between the fixed electrode and the movable electrode for each layer. Moreover, the acceleration sensor can be provided on the substrate where the integrated circuit is provided.

Sixth Aspect

A sixth aspect of the invention is directed to the acceleration sensor described above, wherein each of the fixed electrode, the movable electrode, the support member, and the movable unit is formed by the use of monocrystal silicon.

According to this aspect of the invention, the fixed electrode, the movable electrode, and the movable unit are made of monocrystal silicon. Thus, deformation by thermal stress can be reduced, and the thick structure can be easily produced.

Seventh Aspect

A seventh aspect of the invention is directed to the acceleration sensor described above, wherein each of the fixed electrode, an electronic device comprising the acceleration sensor.

Accordingly, increase in shock resistance of electronic device can be achieved.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments according to the invention are hereinafter described in detail with reference to the drawings.

First Embodiment

Figure 1A:
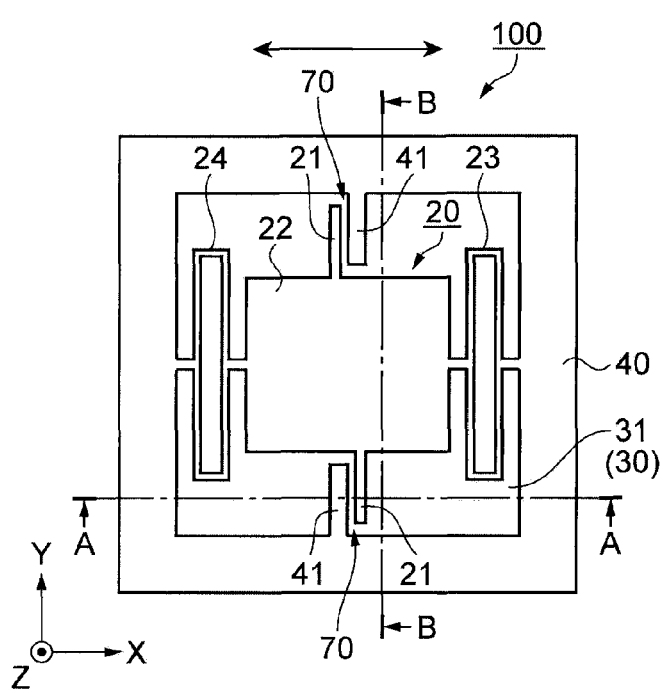
FIG. 1A is a plan view schematically illustrating an acceleration sensor according to a first embodiment.
Figure 1C:
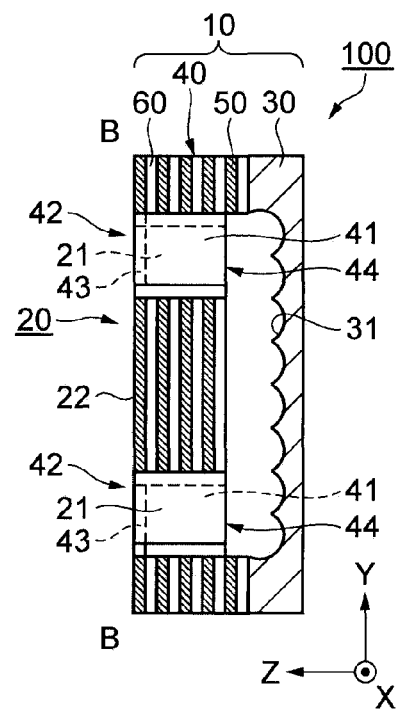
FIG. 1C is a cross-sectional view schematically illustrating the acceleration sensor taken along a line B-B in FIG. 1A.
Figure 1B:
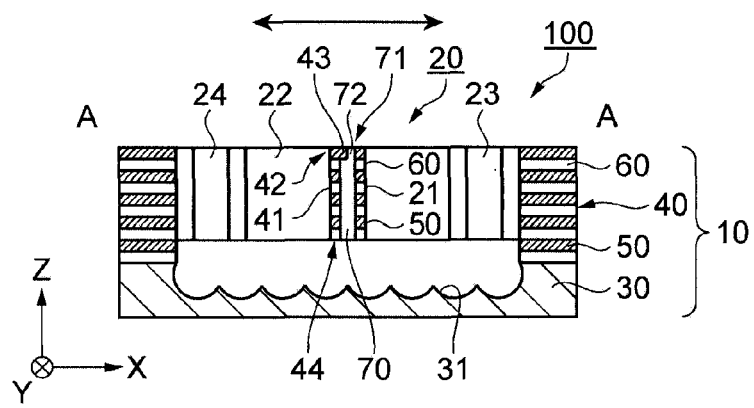
FIG. 1B is a cross-sectional view schematically illustrating the acceleration sensor taken along a line A-A in FIG. 1A.

FIGS. 1A through 1C schematically illustrate an acceleration sensor 100 according to a first embodiment. FIG. 1A is a plan view schematically showing the acceleration sensor 100. FIG. 1B is a cross-sectional view schematically showing the acceleration sensor 100 taken along a line A-A in FIG. 1A. FIG. 1C is a cross-sectional view schematically showing the acceleration sensor 100 taken along a line B-B in FIG. 1A. In these figures, X, Y, and Z axis directions are shown.

Double arrows in the figures represent the acceleration detection direction. In this embodiment, the X axis direction corresponds to the acceleration detection direction.

As illustrated in FIGS. 1A through 1C, the acceleration sensor 100 includes a support member 10 and a movable unit 20.

The support member 10 has a substrate 30 and a support unit 40 provided on the substrate 30. The movable unit 20 is also disposed on the substrate 30.

The substrate 30 is a silicon substrate which has a concave 31 on the surface opposed to the movable unit 20 of the substrate 30 to produce a clearance between the substrate 30 and the movable unit 20. The depth of the concave 31 is determined such that the movable unit 20 does not collide against the substrate 30 when the movable unit 20 is bended toward the substrate 30 by shock given to the movable unit 20 in the Z axis direction.

The movable unit 20 and the support unit 40 are formed by using a laminated layer structure which includes wiring layers (conductive layers) 50, between-layer insulation films (insulated layers) 60 and others constituting a CMOS (complementary metal oxide semiconductor) integrated circuit 400 provided on other area of the substrate 30 as an integrated circuit described later, for example.

The wiring layers 50 are made of Al, Cu, Al alloy, Mo, Ti, W, Pt or the like. The wiring layers 50 include barrier films made of TiN, Ti, TiW, TaN, WN, VN, ZrN, NbN or the like and anti-reflection films made of TiN, Ti or the like provided for forming the CMOS integrated circuit 400. The wiring layers 50 further include gate electrodes of the CMOS. The gate electrodes are made of polycrystal silicon including impurities, silicide, W or the like.

The between-layer insulation films 60 are made of $SiO_2$, TEOS (tetraethoxysilane), BPSG (borophosphosilicate glass), NSG (non-doped silicon glass), SOG (spin on glass), or the like. The laminated layer structure may include a protection film made of SiN, $SiO_2$ or the like and formed on the outermost surface of the CMOS integrated circuit 400.

The wiring layers 50 made of Al or the like can be produced by sputtering, vacuum deposition, CVD (chemical vapor deposition) or other methods. The between-layer insulation films 60 made of $SiO_2$ or the like can be produced by CVD, thermal oxidation, spin coating, burning or other methods.

The movable unit 20 and the support unit 40 are not required to have the laminated layer structure of the CMOS integrated circuit 400 but may have laminated layer structure formed exclusively for the movable unit 20 and the support unit 40.

The support unit 40 as a substantially rectangular frame body is disposed on the substrate 30. The support unit 40 includes fixed electrodes 41. The fixed electrodes 41 are located approximately at the centers of a pair of opposed inner surfaces of the support unit 40 in such a manner as to extend toward the inside of the frame body. The fixed electrodes 41 have rectangular parallelepiped plate shapes.

The movable unit 20 has movable electrodes 21, a weight 22, and springs (connection members) 23 and 24. The weight 22 has an approximately rectangular parallelepiped shape. The movable unit 20 is supported at two positions approximately at the center of the area surrounded by the support unit 40 as the substantially rectangular frame body via the other pair of the inner surfaces of the support unit 40 where the fixed electrodes 41 are not disposed and the two springs 23 and 24.

The springs 23 and 24 are constituted by two opposed plate springs each of which is fixed at both ends. One of the two plate springs is connected with the support unit 40, and the other plate spring is connected with the weight 22.

The movable electrodes 21 are disposed on the weight 22 at positions opposed to the fixed electrodes 41. The movable electrodes 21 have rectangular parallelepiped plate shapes similarly to the fixed electrodes 41.

The wide surfaces of the rectangular parallelepiped shapes of the movable electrodes 21 and the fixed electrodes 41 are disposed opposed to each other via clearances 70 to generate capacity between the movable electrodes 21 and the fixed electrodes 41.

The pairs of the movable electrode 21 and the fixed electrode 41 are provided at two opposed points with the weight 22 interposed between the points as a differential detection type which increases one of the clearances when the other clearance decreases.

Each of the clearances 70 has a narrow portion 72 on an edge portion 71. The narrow portion 72 is produced by forming a projection 43 which projects toward the movable electrode 21 from an edge portion 42 corresponding to one side of the surface of the fixed electrode 41 opposed to the movable electrode 21 on the side opposite to the substrate 30 side.

According to the example shown in FIGS. 1A through 1C, the projection 43 is formed by using the wiring layer 50. However, when the between-layer insulation film 60 is disposed on the edge portion 42, the projection 43 may be formed by using the between-layer insulation film 60.

As illustrated in FIG. 1C, the projection 43 is provided on the edge portion 42 extending in the Y axis direction from the fixed electrode 41. In this case, the cross-sectional shape of the fixed electrode 41 becomes L-shaped as illustrated in FIG. 1B.

The narrow portion 72 may be disposed on an edge portion 44 on the substrate 30 side opposite to the edge portion 42 side. The narrow portion 72 may be further provided on both of the edge portions 42 and 44. In this case, the cross-sectional shape of the fixed electrode 41 becomes a concaved groove shape. Alternatively, the projection 43 may be formed on the movable electrode 21 to produce the narrow portion 72 thereon.

In case of the structure which includes the acceleration sensor 100 and the CMOS integrated circuit 400 disposed on the same substrate 30, the sizes of the respective components are not particularly limited. For example, the following sizes can be adopted.

The thickness of the laminated layer structure of the movable unit 20 and the support unit 40 is several micrometers.

The support unit 40 is a frame body in the shape of a square of several millimeters. The thickness of each layer of the laminated layer structure is about 1 micrometer. The width of the clearance 70 between the movable electrode 21 and the fixed electrode 41 is several micrometers. The mass of the weight 22 is several $10^{-6}$ grams.

The movable unit 20 and the support unit 40 can be formed by a combination of anisotropic and isotropic etching which etches the surface of the laminated layer structure including the wiring layers 50 and the between-layer insulation films 60 from the surface side.

Figure 2A:
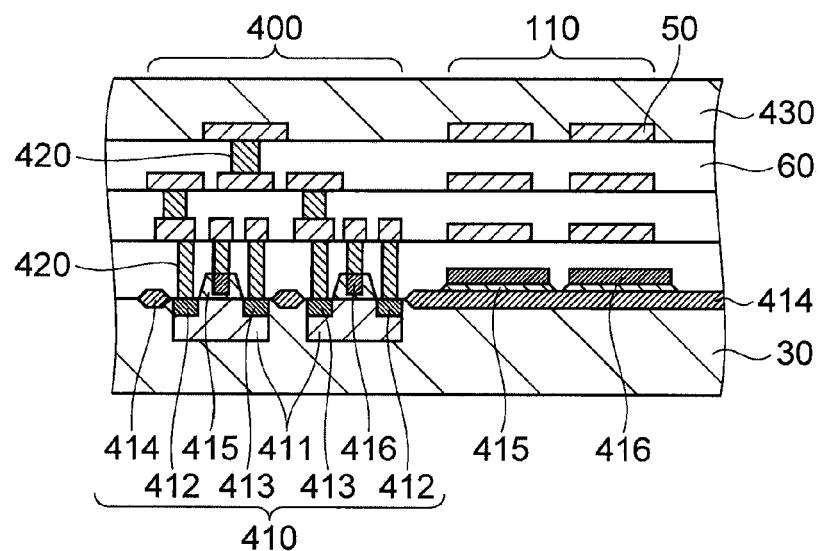
FIGS. 2A through 2C are cross-sectional views schematically illustrating a manufacturing process for producing a CMOS integrated circuit and the acceleration sensor on a substrate.
Figure 2B:
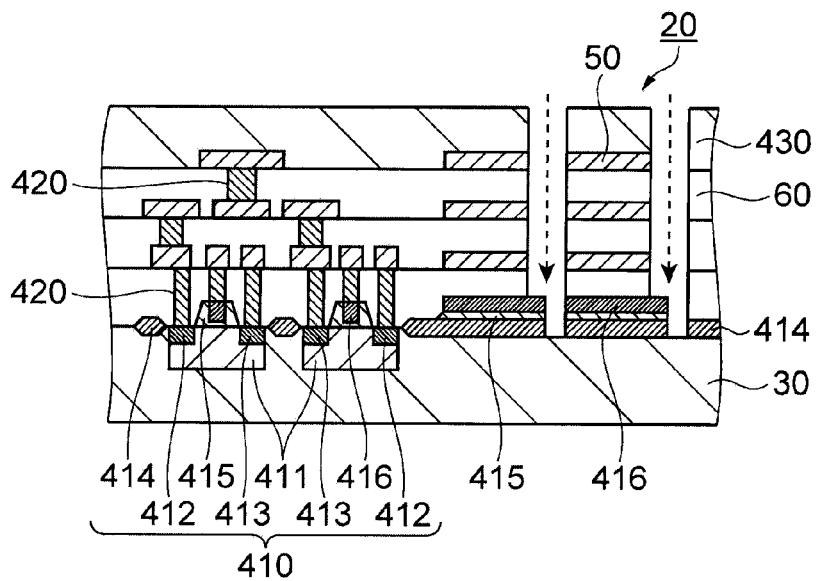
Figure 2C:
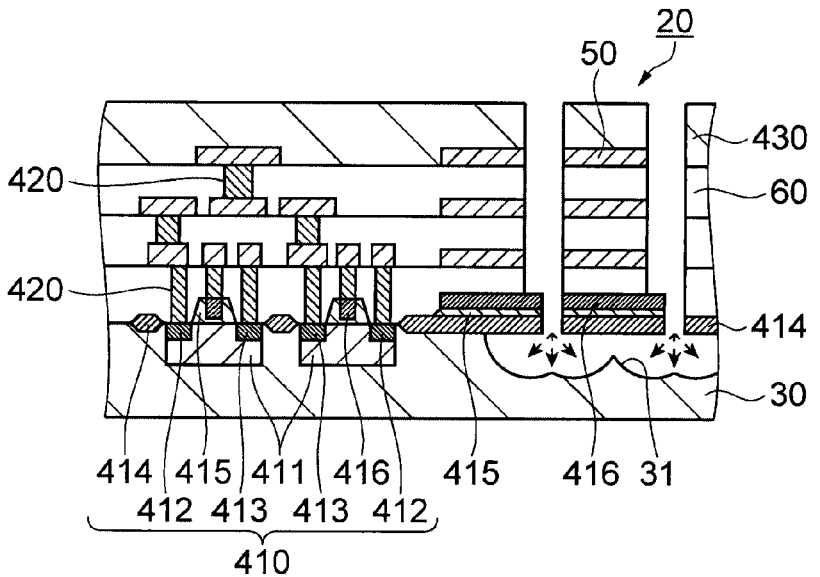

FIGS. 2A through 2C are cross-sectional views schematically illustrating a manufacturing process for producing the CMOS integrated circuit 400 and the acceleration sensor 100 on the substrate 30 as an example.

FIG. 2A shows a step for producing the CMOS integrated circuit 400 and an acceleration sensor portion 110 prior to etching. FIG. 2B shows a step for anisotropically etching the between-layers insulation film 60 and others. FIG. 2C shows a step for isotropically etching the substrate 30.

As illustrated in FIG. 2A, impurity diffusion layers 411, sources 412, drains 413, an LOCOS (local oxidation of silicon) 414, a gate oxide film 415, gates 416, and others constituting a transistor 410 are formed on the substrate 30. Then, plugs 420, the wiring layers 50, the between-layer insulation films 60, a protection film 430 and others are repeatedly laminated on the transistor 410 and etched to complete the CMOS integrated circuit 400 by a known method.

During this process, the LOCOS 414, the gate oxide film 415, and the gates 416 and others are formed on the acceleration sensor portion 110 prior to etching, and then the between-layer insulation films 60, the wiring layers 50, the protection film 430 and others are laminated on the acceleration sensor portion 110.

As illustrated in FIG. 2B, the between-layer insulation films 60 and others are anisotropically etched from the protection film 430 side. The anisotropic etching is performed by ICP (inductively coupled plasma) etching, for example, using mixed gas such as $CF_4$, $CH_3$, and He as etching gas under pressure of 10 to 20 Pa by RF power of 600 to 800 W. The etching time is 10 to 20 minutes when the total film thickness of the protection film 430 and the between-layer insulation films 60 is 4 to 6 μm.

As illustrated in FIG. 2C, the silicon substrate 30 is isotropically etched from the protection film 430 side to form the concave 31. The isotropic etching is performed by ICP (inductively coupled plasma) etching, for example, using mixed gas of $SF_6$ and $O_2$ as etching gas under pressure of 1 to 100 Pa by RF power of about 100 W. The etching time is several minutes when the depth of the concave 31 is 2 to 3 μm. By this etching, the movable unit 20 and others are separated from the substrate 30.

According to the acceleration sensor 100, the distance between the fixed electrode 41 and the movable electrode 21 changes when acceleration is given in the X axis direction. As a result, the capacity between these electrodes 41 and 21 changes. Thus, acceleration can be measured by detecting the capacity change.

According to this embodiment, the following advantages can be offered.

(1) When acceleration is given in the X axis direction as the direction of changing the distance between the fixed electrode 41 and the movable electrode 21, the gas existing in the clearance 70 between the fixed electrode 41 and the movable electrode 21 flows in one direction by the function of the projection 43 extending in one direction from the opposed surface. In this case, the attenuation constant c increases by squeeze film damping produced by the flow of the gas. Therefore, the attenuation constant c can be controlled by the structure of the clearance 70 between the fixed electrode 41 and the movable electrode 21 without narrowing the gap between the movable unit 20 and the support member 10. Accordingly, reduction of collision destruction between the movable unit 20 and the support member 10 and thus increase in shock resistance of the acceleration sensor 100 can be achieved.

(2) Since the projection 43 is provided in parallel with the edge, the flow of the gas existing in the clearance 70 between the fixed electrode 41 and the movable electrode 21 can be further equalized in a constant direction. As a result, the attenuation constant c further increases by the squeeze film damping. Accordingly, further reduction of collision destruction between the movable unit 20 and the support member 10 and thus increase in shock resistance of the acceleration sensor 100 can be achieved.

(3) Since the projection 43 is provided on the edge portion 42, most of the gas existing in the clearance 70 between the fixed electrode 41 and the movable electrode 21 contributes to the squeeze film damping. Thus, the attenuation constant c further increases. Accordingly, further reduction of collision destruction between the movable unit 20 and the support member 10 and thus increase in shock resistance of the acceleration sensor 100 can be achieved.

(4) The gap between the movable unit 20 and the support member 10 can be sufficiently expanded by the concave 31 formed on the substrate 30. Accordingly, reduction of collision destruction between the movable unit 20 and the support member 10 and thus increase in shock resistance of the acceleration sensor 100 can be achieved.

(5) Since the fixed electrode 41 and the movable electrode 21 are laminated layers, these electrodes 41 and 21 can be processed for each layer. Thus, the narrow portion 72 can be easily formed between the fixed electrode 41 and the movable electrode 21 for each layer. Moreover, the acceleration sensor 100 can be provided on the substrate 30 where the CMOS integrated circuit 400 is provided.

Second Embodiment

Figure 3A:
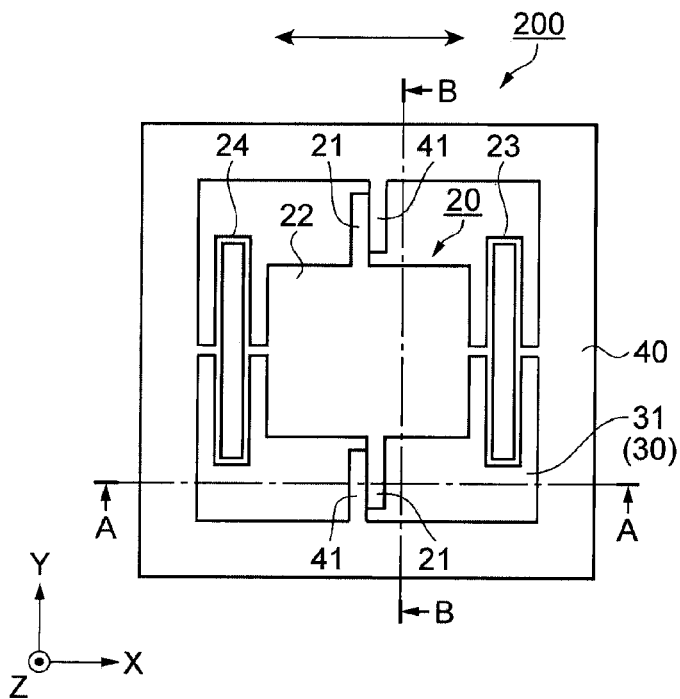
FIG. 3A is a plan view schematically illustrating an acceleration sensor according to a second embodiment.
Figure 3C:
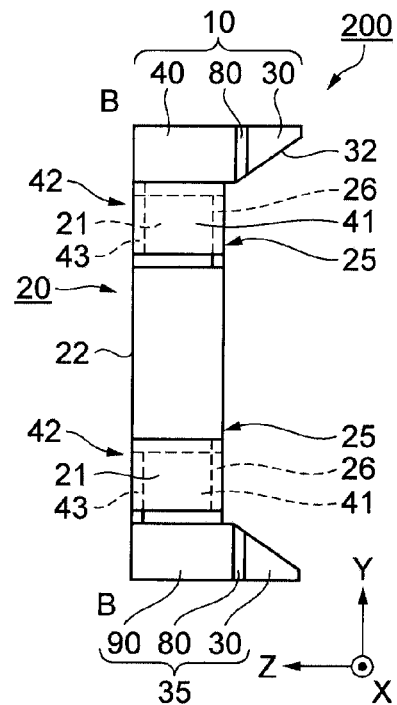
FIG. 3C is a cross-sectional view schematically illustrating the acceleration sensor taken along a line B-B in FIG. 3A.
Figure 3B:
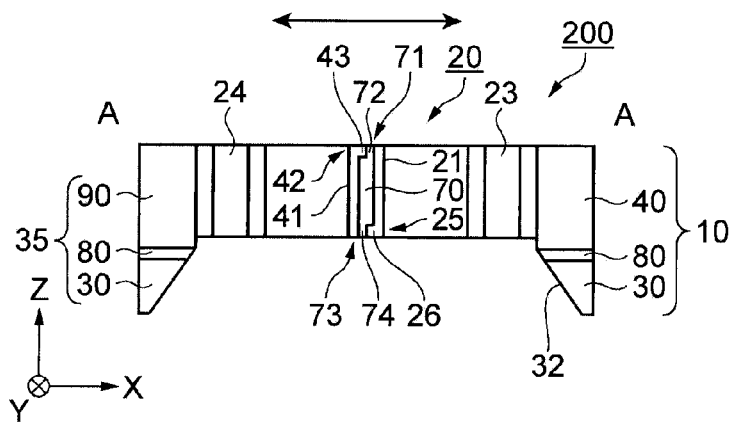
FIG. 3B is a cross-sectional view schematically illustrating the acceleration sensor taken along a line A-A in FIG. 3A.

FIGS. 3A through 3C schematically illustrate an acceleration sensor 200 according to a second embodiment. FIG. 3A is a plan view schematically showing the acceleration sensor 200. FIG. 3B is a cross-sectional view schematically showing the acceleration sensor 200 taken along a line A-A in FIG. 3A. FIG. 3C is a cross-sectional view schematically showing the acceleration sensor 200 taken along a line B-B in FIG. 3A. In these figures, X, Y, and Z axis directions are shown. Double arrows in the figures indicate the acceleration detection direction. In this embodiment, the acceleration detection direction corresponds to the X axis direction similarly to the first embodiment.

Similar reference numbers are given to components similar to those in the first embodiment. In the following explanation, the points different from the first embodiment are chiefly touched upon.

As illustrated in FIGS. 3A through 3C, the structure of the acceleration sensor 200 is substantially similar to that of the acceleration sensor 100 in the first embodiment.

The structure of this embodiment is different from that of the first embodiment in that a projection 26 is also provided on an edge portion 25 of each of the movable electrodes 21 such that the movable electrodes 21 have L-shaped cross sections. In this structure, the narrow portion 72 and a narrow portion 74 are provided on the edge portion 71 and an edge portion 73 of the clearance 70 in the Z axis direction, respectively. In addition, the second embodiment is different from the first embodiment in that penetrating portions 32 are formed on the substrate 30.

As illustrated in FIG. 3C, the projections 43 and 26 are provided on the edge portion 42 extending in the Y direction from the fixed electrode 41, and the edge portion 25 extending in the Y axis direction from the movable electrode 21, respectively.

The second embodiment is considerably different from the first embodiment in the following point.

According to the first embodiment, the substrate 30 is formed by a silicon substrate, and the support unit 40 and the movable unit 20 have the laminated layer structure which includes the wiring layers 50 and the between-layer insulation films 60 constituting the CMOS integrated circuit 400 formed on other area of the substrate 30. According to the second embodiment, however, a semiconductor substrate 35 having SOI (silicon on insulator) structure is employed. The SOI structure has a monocrystal silicon layer 90 formed on an embedded oxide film 80 made of silicon oxide with the embedded oxide film 80 sandwiched between the layers.

The movable unit 20 and the support unit 40 are produced by etching the monocrystal silicon layer 90. The penetrating portions 32 of the substrate 30 are produced by etching the surface opposed to the surface on which the monocrystal silicon layer 90 is formed.

Figure 4A:
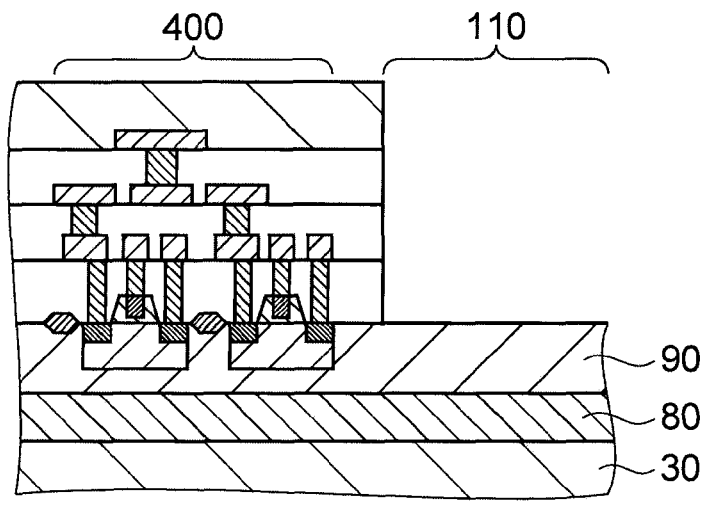
FIGS. 4A through 4C are cross-sectional views schematically illustrating a manufacturing process for producing a CMOS integrated circuit and the acceleration sensor on a substrate.
Figure 4B:
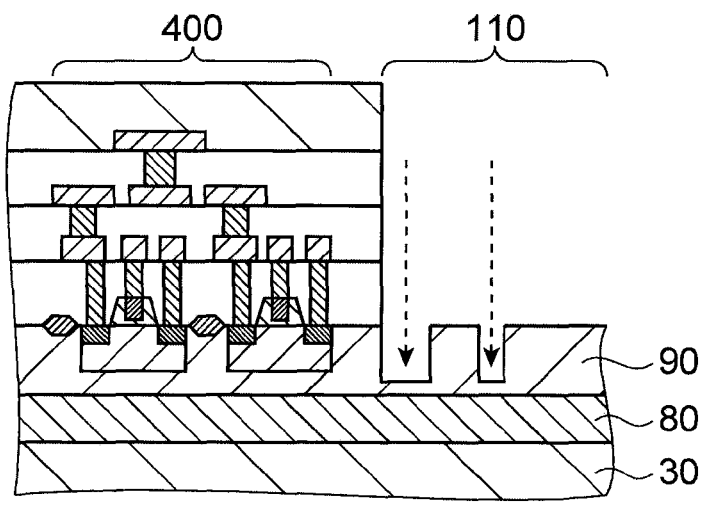
Figure 4C:
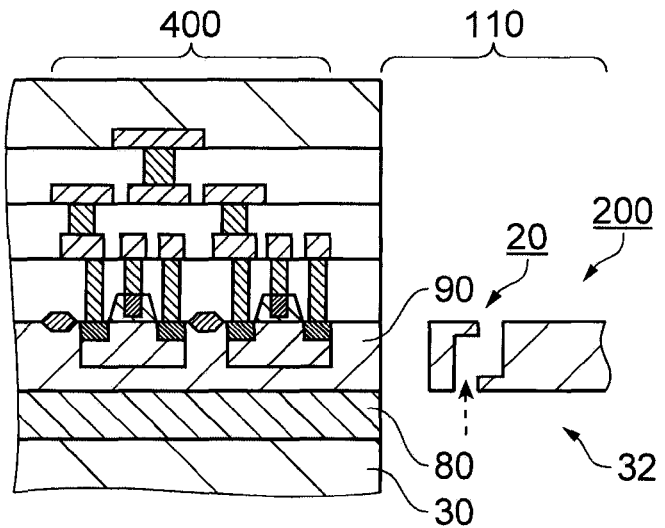

FIGS. 4A through 4C illustrate an example of a simplified manufacturing process for producing the CMOS integrated circuit 400 and the acceleration sensor 200 on the semiconductor substrate 35 having the SOI structure.

FIG. 4A shows a step for producing the CMOS integrated circuit 400. FIG. 4B shows a step for anisotropically etching the monocrystal silicon layer 90 from the surface on which the CMOS integrated circuit 400 is formed. FIG. 4C shows a step for anisotropically etching the substrate 30 from the substrate 30 side.

As illustrated in FIG. 4A, the CMOS integrated circuit 400 is produced on the monocrystal silicon layer 90 by a known method similarly to the first embodiment. In this case, nothing is formed on the acceleration sensor portion 110.

As illustrated in FIG. 4B, the monocrystal silicon layer 90 is anisotropically etched from the surface on which the COMS integrated circuit 400 is formed. The anisotropic etching is performed by ICP etching with a mask of $SiO_2$ or the like in the shape of the acceleration sensor 200.

As illustrated in FIG. 4C, the substrate 30 and the embedded oxide film 80 are anisotropically etched from the substrate 30 side to form the penetrating portion 32 and separate the movable unit 20. The anisotropic etching is performed by a method similar to the method for etching the monocrystal silicon layer 90 from the surface on which the CMOS integrated circuit 400 is formed.

According to this embodiment, the following advantages can be offered.

(5) Since the plural projections 43 and 26 are provided in parallel with each other, the flow of the gas is further equalized in a constant direction. As a result, the attenuation constant c further increases. Accordingly, further reduction of collision destruction between the movable unit 20 and the support member 10 and thus increase in shock resistance of the acceleration sensor 200 can be achieved.

(6) Since the fixed electrodes 41, the movable electrodes 21, and the movable unit 20 are made of monocrystal silicon, deformation by thermal stress can be reduced. Thus, the thick structure can be easily produced.

Third Embodiment

Figure 5A:
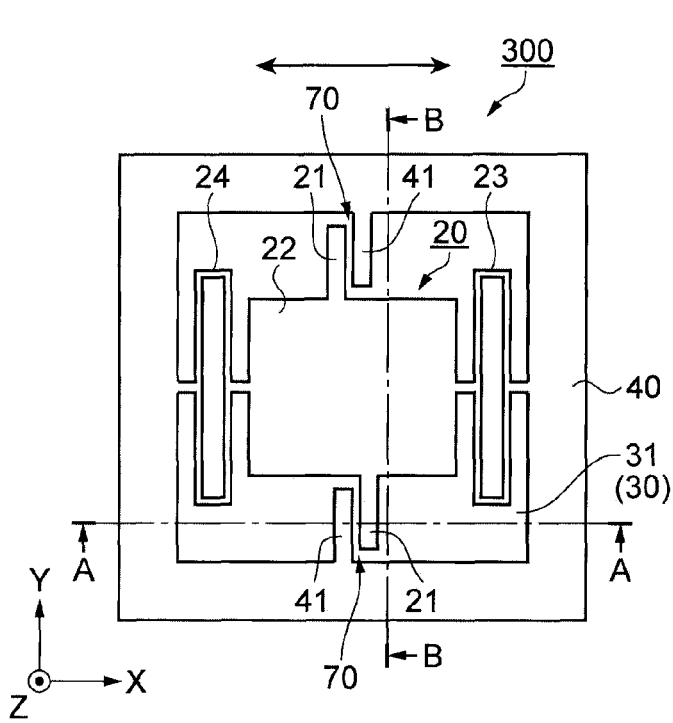
FIG. 5A is a plan view schematically illustrating an acceleration sensor according to a third embodiment.
Figure 5C:
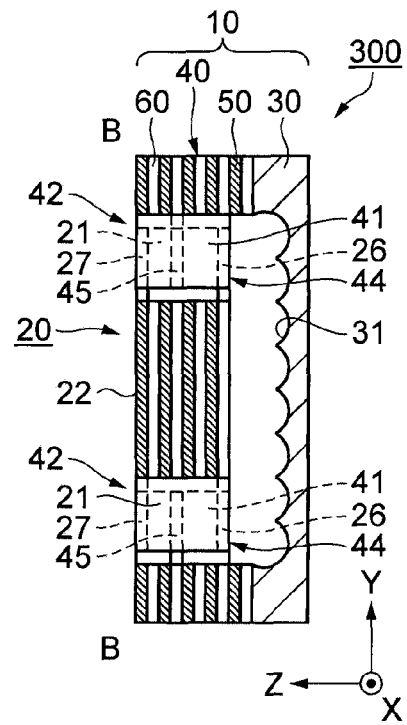
FIG. 5C is a cross-sectional view schematically illustrating the acceleration sensor taken along a line B-B in FIG. 5A.
Figure 5B:
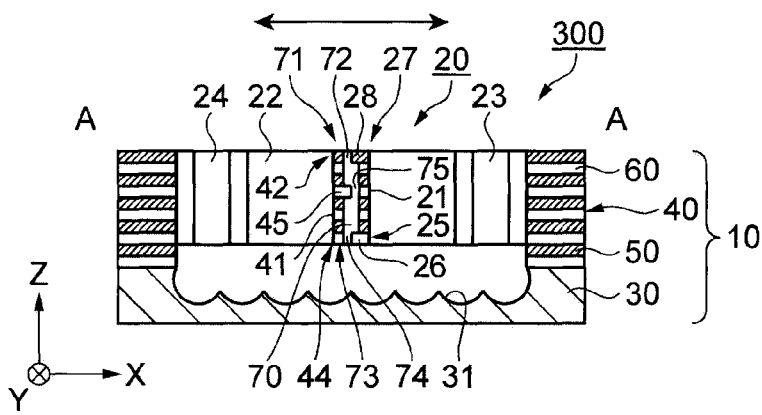
FIG. 5B is a cross-sectional view schematically illustrating the acceleration sensor taken along a line A-A in FIG. 5A.

FIGS. 5A through 5C schematically illustrate an acceleration sensor 300 according to a third embodiment. FIG. 5A is a plan view schematically showing the acceleration sensor 300. FIG. 5B is a cross-sectional view schematically showing the acceleration sensor 300 taken along a line A-A in FIG. 5A. FIG. 5C is a cross-sectional view schematically showing the acceleration sensor 300 taken along a line B-B in FIG. 5A. In these figures, X, Y, and Z axis directions are shown. Double arrows in the figures indicate the acceleration detection direction. In this embodiment, the acceleration detection direction corresponds to the X axis direction.

Similar reference numbers are given to components similar to those in the first and second embodiments. In the following explanation, the points different from the first and second embodiments are chiefly touched upon.

According to this embodiment, the movable electrode 21 has a concave cross-sectional shape, and the fixed electrode 41 has a projection cross-sectional shape.

The movable electrode 21 has the projection 26 and a projection 28 on the edge portion 25 and an edge portion 27, respectively, to form the narrow portions 72 and 74 on the clearance 70. On the other hand, the fixed electrode 41 has a projection 45 between the edge portion 42 and the edge portion 44 to form a narrow portion 75.

Thus, the projection 45 of the fixed electrode 41 is disposed within the concave groove formed by the projections 26 and 28 of the movable electrode 21.

As illustrated in FIG. 5C, the projection 45 extends in the Y axis direction from the fixed electrode 41.

According to this embodiment, the following advantages can be offered.

(6) Since the plural projections 26, 28 and 45 are provided in parallel with one another, the flow of the gas is further equalized in a constant direction. As a result, the attenuation constant c further increases. Accordingly, further reduction of collision destruction between the movable unit 20 and the support member 10 and thus increase in shock resistance of the acceleration sensor 300 can be achieved.

Various modifications and changes from the embodiments described above can be made as described below.

The structures of the springs 23 and 24 may be arbitrarily designed. For example, both the ends of one plate spring may be connected with the support unit 40, and the center of the plate spring may be connected with the weight 22.

While only two pairs of the movable electrode 21 and the fixed electrode 41 are provided in the embodiments, three or more pairs disposed in comb-teeth shape may be employed. In addition, while the movable electrodes 21 and the fixed electrodes 41 in the rectangular shape are opposed to each other in the embodiments, the electrodes 21 and 41 may have other shapes.

The movable electrodes 21 and the fixed electrodes 41 are not required to be parallel flat plates as long as the electrodes do not collide with one another when acceleration is given.

The acceleration sensor may be a two-dimensional-direction acceleration sensor which includes electrodes extending in the X axis direction for detection in the ±Y axis directions.

The gas may be rare gas such as He and Ne, nitrogen gas or the like other than air. The attenuation coefficient c can be further increased by using a medium which has a viscosity coefficient larger than that of air.

The present invention is not limited to this, the acceleration sensor 100,200,300 also can be used for electronic device such as a digital camera, a car navigation system, a mobile phone, a mobile personal computer, a game controller. It is possible to increase in shock resistance of electronic device.

The entire disclosure of Japanese Patent Application No. 2009-040319, filed Feb. 24, 2009 and No. 2010-030989, filed Feb. 16, 2010 is expressly incorporated by reference herein.

What is claimed is:

1. An acceleration sensor comprising:
   a support member;
   a fixed electrode extending from a first base of the support member in a first direction, the fixed electrode being in the form of an arm;
   a movable unit;
   a movable electrode extending from a second base of the movable unit in a second direction opposite to the first direction and disposed opposite to the fixed electrode across a gap, the movable electrode being in the form of an arm;
   an elastically deformable connection member connecting the support member and the movable unit;
   the fixed electrode has an opposite surface opposite to the movable electrode; and
   a projection formed at the opposite surface of the fixed electrode, wherein
   a first tip of the fixed electrode is adjacent to the movable unit,
   the projection is continuously formed from the first base to the first tip in the first direction,
   the projection is projected from the opposite surface toward the movable electrode, and
   a first width of the fixed electrode where the projection is formed, in a width direction perpendicular to the first direction is larger than a second width of the fixed electrode, where the projection is not formed, in the width direction.

2. The acceleration sensor according to claim 1, wherein the opposite surface has one end in a third direction perpendicular to the first and second directions and another end opposite the one end, the projection is formed at least at either the one end or the other end.

3. The acceleration sensor according to claim 1, wherein the movable electrode has another a opposite surface opposite to the fixed electrode,
   another projection is formed at the another opposite surface,
   a second tip of the movable electrode is adjacent to the support member,
   the another projection is continuous formed from he second base to the second tip in the second direction,
   the another projection is projected from the another opposite surface toward the opposite surface, and
   a third width of the movable electrode, where the another projection is formed, in the width direction perpendicular to the second direction is larger than a fourth width of the movable electrode, where the another projection is not formed, in the width direction.

4. The acceleration sensor according to claim 1, wherein each of the fixed electrode, the movable electrode, the support member, and the movable unit has a laminated layer structure alternately piled up a conductive layer and an insulated layer.

5. The acceleration sensor according to claim 4, wherein the projection is formed by the use of the conductive layer or the insulated layer.

6. The acceleration sensor according to claim 1, wherein each of the fixed electrode, the movable electrode, the support member, and the movable unit is formed by the use of monocrystal silicon.

7. An electronic device comprising the acceleration sensor according to claim 1.

8. An electronic device comprising the acceleration sensor to claim 2.

9. An electronic device comprising the acceleration sensor according to claim 3.

10. An electronic device comprising the acceleration sensor to claim 4.

11. An electronic device comprising the acceleration sensor to claim 5.

12. An electronic device comprising the acceleration sensor to claim 6.

13. An acceleration sensor comprising:
a support member;
a fixed electrode extending from a first base of the support member in a first direction, the fixed electrode being in the form of an arm;
a movable unit;
a movable electrode extending from a second base of the movable unit in a second direction opposite to the first direction and disposed opposite to the fixed electrode across a gap, the movable electrode being in the form of an arm;
an elastically deformable connection member connecting the support member and the movable unit;
the movable electrode has an opposite surface opposite to the fixed electrode; and
a projection formed at the opposite surface of the movable electrode, wherein
a first tip of the movable electrode is adjacent to the support member,
the projection is continuously formed from the second base to the first tip in the second direction,
the projection is projected from the opposite surface toward the fixed electrode, and
a first width of the movable electrode, where the projection is formed, in a width direction perpendicular to the second direction is larger than a second width of the movable electrode, where the projection is not formed, in the width direction.

14. The acceleration sensor according to claim 13, wherein the opposite surface has one end in a third direction perpendicular to the first and second directions and another end opposite the one end, the projection is formed at least at either the one end or the other end.

15. The acceleration sensor according to claim 13, wherein the fixed electrode has another opposite surface opposite to the movable electrode,
another projection is formed at the another opposite surface,
a second tip of the fixed electrode is adjacent to the movable unit,
the another projection is continuously formed from the first base to the second tip in the first direction,
the another projection is projected from the another opposite surface toward the opposite surface, and
a third width of the fixed electrode, where the another projection is formed, in the width direction perpendicular to the first direction is larger than a fourth width of the fixed electrode, where the another projection is not formed, in the width direction.

16. The acceleration sensor according to claim 13, wherein each of the fixed electrode, the movable electrode, the support member, and the movable unit has a laminated layer structure of a conductive layer and an insulated layer.

17. The acceleration sensor according to claim 16, wherein the projection is formed by the conductive layer or the insulated layer.

18. The acceleration sensor according to claim 13, wherein each of the fixed electrode, the movable electrode, the support member, and the movable unit is formed of monocrystal silicon.

\* \* \* \* \*